(12) United States Patent
Liaw

(10) Patent No.: US 9,177,908 B2  
(45) Date of Patent: Nov. 3, 2015

(54) STACKED SEMICONDUCTOR CAPACITOR STRUCTURE

(75) Inventor: Jhon Jhy Liaw, Hsin-Chu (TW)

(73) Assignee: Taiwan Semiconductor Manufacturing Company, Limited, Hsin-Chu (TW)

( * ) Notice: Subject to any disclaimer, the term of this patent is extended or adjusted under 35 U.S.C. 154(b) by 1416 days.

(21) Appl. No.: 11/742,421

(22) Filed: Apr. 30, 2007

(65) Prior Publication Data

US 2008/0265369 A1 Oct. 30, 2008

(51) Int. Cl.
- H01L 29/92 (2006.01)
- H01L 23/522 (2006.01)
- H01L 23/532 (2006.01)
- H01L 49/02 (2006.01)

(52) U.S. Cl.
CPC ............ *H01L 23/5223* (2013.01); *H01L 28/60* (2013.01); *H01L 2924/0002* (2013.01)

(58) Field of Classification Search
CPC ..................... H01L 23/5223; H01L 21/76807; H01L 23/5222; H01L 29/92
USPC ................. 257/532, 773, 774; 361/306.1
See application file for complete search history.

(56) References Cited

U.S. PATENT DOCUMENTS

| | | | |
|---|---|---|---|
| 5,479,316 A | 12/1995 | Smrtic et al. | 361/322 |
| 5,708,559 A | 1/1998 | Brabazon et al. | 361/313 |
| 6,037,621 A | 3/2000 | Wilson | 257/296 |
| 6,117,747 A | 9/2000 | Shao et al. | 438/396 |
| 6,465,832 B1 * | 10/2002 | Maeda et al. | 257/307 |
| 6,570,210 B1 | 5/2003 | Sowlati et al. | 257/307 |
| 6,597,562 B1 | 7/2003 | Hu et al. | 361/306.3 |
| 6,624,040 B1 | 9/2003 | Ng et al. | 438/422 |
| 6,664,192 B2 * | 12/2003 | Satta et al. | 438/704 |
| 6,680,542 B1 | 1/2004 | Gibson et al. | 257/774 |
| 6,690,570 B2 * | 2/2004 | Hajimiri et al. | 361/306.1 |
| 6,743,671 B2 | 6/2004 | Hu et al. | 438/253 |
| 6,822,312 B2 * | 11/2004 | Sowlati et al. | 257/532 |
| 7,866,015 B2 * | 1/2011 | Chinthakindi | 29/25.42 |
| 2002/0038903 A1 * | 4/2002 | Tsau | 257/532 |
| 2002/0093780 A1 | 7/2002 | Hajimiri et al. | 361/306.1 |
| 2002/0155722 A1 | 10/2002 | Satta et al. | |
| 2005/0082678 A1 * | 4/2005 | Barth | 257/774 |
| 2006/0087004 A1 * | 4/2006 | Furumiya et al. | 257/532 |

* cited by examiner

*Primary Examiner* — Jerome Jackson, Jr.  
*Assistant Examiner* — Paul Budd  
(74) *Attorney, Agent, or Firm* — Haynes and Boone, LLP

(57) ABSTRACT

The present invention discloses a capacitor in an integrated circuit which comprises a first and second conductive lines substantially parallel to each other and having a thickness equals substantially to a sum of a via thickness and an interconnect thickness, the first and second conductive lines, the via and the interconnect being formed by a single deposition step, and at least one dielectric material in a space horizontally across the first and second conductive lines, wherein the first and second conductive lines serve as two conductive plates of the capacitor, respectively, and the dielectric material serves as an insulator of the capacitor.

9 Claims, 5 Drawing Sheets

STACKED SEMICONDUCTOR CAPACITOR STRUCTURE

BACKGROUND

The present invention relates generally to semiconductor device structures, and more particularly to forming capacitors in an integrated circuit.

Capacitors are critical components in an integrated circuit (IC), de-coupling power supply lines or forming series inductance-capacitor circuit for noise immunization and high speed radio frequency (RF) applications. For example, in an IC having analog circuits, capacitors are often placed near the analog circuits to de-coupling or stabilizing a power supply to the analog circuits.

A semiconductor capacitor is typically constructed with an insulator or dielectric material sandwiched between two parallel conductive plates. When a voltage difference is applied across the plates, a certain electrical charge is stored in the insulator. The amount of electrical charge stored in the insulator is defined by the capacitance of the capacitor. Both polysilicon and metal are used to form the conductive plates. However, metal-oxide-metal (MOM) capacitors have seen their increased popularity because of their minimal capacitive loss to the substrate and compatibility with logic processes.

Conventional MOM capacitors are constructed in such structures as a vertical stack, U-shape plates or horizontal stacks. The vertical stack structure is a bottom conductive plate first covered by a thin dielectric layer, then covered by a top conductive plate on top of the dielectric layer. A capacitor is formed by the vertically stacked conductor/dielectric/conductor. This kind of vertical stack structure may occupy large areas. Forming such capacitor and making connection thereto may require at least two to four layers of material depositions as well as additional two to three masking steps. The U-shape plate structure employs damascene like processes that include oxide deposition, U-shape opening, bottom plate deposition, thin dielectric deposition, top plate deposition, U-shape fill and chemical-mechanical-planarization (CMP) or etch back process steps. Both the vertical stack and U-shape plate structures require complex additional process steps and additional cost on lithograph, etching and deposition.

The horizontal stack is the most simple and lowest costly (no additional process steps or complexity) structure among the three conventional structures for forming a semiconductor capacitor. The horizontal stack structure employs coupling capacitances between sidewalls of two adjacent metal lines. The most popular layout style is to place multiple cathode and anode metal lines of a capacitor alternatively next to each other in a cross-finger style. Between these metal lines is an inter-metal-dielectric (IMD) material serving as capacitor's insulator. A major drawback of the horizontal stack structure is its low unit length capacitance due to limited height and large space of the metal lines. However, as process technologies shrink down to 100 nm generation and beyond, both metal line width and space become small enough to allow the horizontal stack structure to be competitive area wise as well, when the cross-finger layout style is employed.

FIG. 1 is a cross-sectional view of an improved conventional horizontal stack capacitor structure 100 which employs not only the sidewalls of two metal lines 115 and 125, but also the sidewalls of two via lines 110 and 120 as capacitor conductors. The capacitor structure 100 is formed on a dielectric layer 150. The via lines 110 and 120 are formed in an interlayer dielectric (ILD) 130. The metal lines 115 and 125 are formed in an inter-metal dielectric (IMD) 140. Both the ILD and IMD serves as insulators for the capacitor structure 100, therefore, its capacitor area becomes larger. However, a design rule may require that the metal lines 115 and 125 to overlay the via lines 110 and 120, respectively, and at the same time, the metal lines 115 and 125 have to maintain a minimum spacing D. As a result, the insulator of the capacitor structure 100 may not be very thin to achieve a large unit length capacitance value.

As such, what is desired is a simple, reliable and low cost semiconductor capacitor with high capacitance per unit area for advanced process technologies.

SUMMARY

In view of the foregoing, the present invention discloses a horizontal capacitor structure produced by a dual damascene process. In one aspect of the present invention, the horizontal stack capacitor structure comprises a first and second conductive lines substantially parallel to each other and having a thickness equals substantially to a sum of a via thickness and an interconnect thickness, the first and second conductive lines, the via and the interconnect being formed by a single deposition step, and at least one dielectric material in a space horizontally across the first and second conductive lines, wherein the first and second conductive lines serve as two conductive plates of the capacitor, respectively, and the dielectric material serves as an insulator of the capacitor.

In another aspect of the present invention, the horizontal capacitor structure comprises a first, second and third conductive lines substantially parallel to each other and having a thickness equals substantially to a sum of a via thickness and an interconnect thickness, the first, second and third conductive lines, the via and the interconnect being formed by a single deposition step, the third conductive line being connected to the first conductive line, and the second conductive line being flanked by the first and third conductive lines, and at least one dielectric material in a first space horizontally across the first and second conductive lines and in a second space horizontally across the second and third conductive lines, wherein the first and third conductive lines serve as a conductive plate of the capacitor, while the second conductive line serves as another conductive plate of the capacitor, and the dielectric material serves as an insulator of the capacitor.

The construction and method of operation of the invention, however, together with additional objects and advantages thereof will be best understood from the following description of specific embodiments when read in connection with the accompanying drawings.

Figure 1:
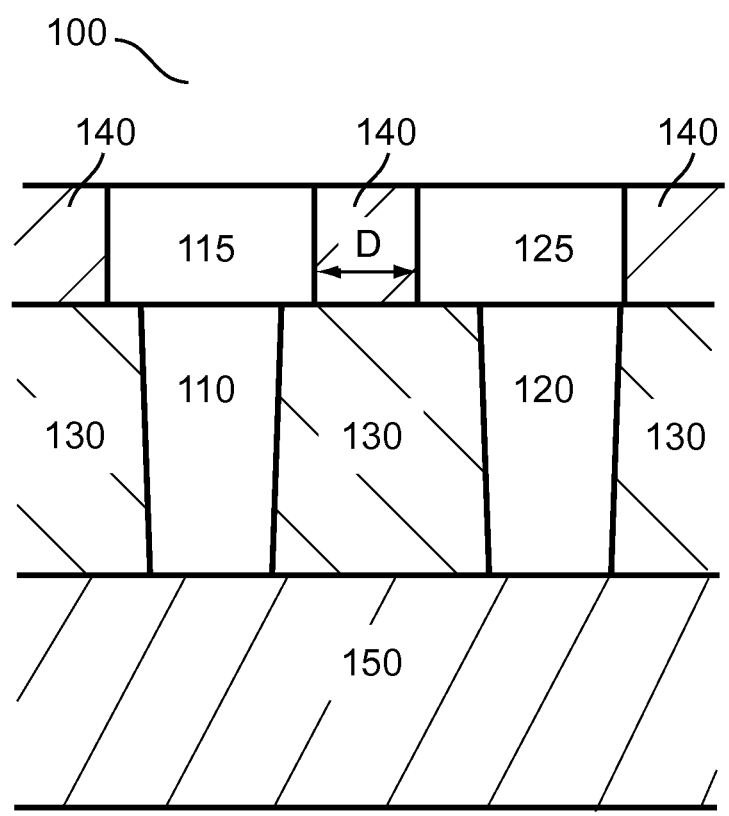
FIG. 1 is a cross-sectional view of an improved conventional horizontal stack capacitor structure.

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein. It should be noted that the features illustrated in the drawings are not necessarily drawn to scale.

DESCRIPTION

The following will provide a detailed description of a horizontal capacitor structure that employs sidewalls of adjacent vias, the height of which equals to traditional metal line height plus via line height. The horizontal capacitor structure results in higher capacitance per unit chip area as well as lower sheet resistance than conventional capacitor structures. Lower sheet resistance allows it to operate at very high switching speeds. Besides, the horizontal capacitor structure has a cost advantage as it does not require additional processing steps.

The present invention is described by an embodiment using a dual damascene process for making vias which serves as metal plates for the horizontal capacitor. Damascene process basically involves forming a pattern of openings in a dielectric layer and filling the openings with a metal to form a conductive pattern or channel. In a dual damascene process, a first channel of conductive material and a second channel of conductive material below the first channel are positioned in vertically separate planes perpendicular to each other and interconnected by a vertical via at the closet point. The first channel opening and via are filled with metal at the same time, thereby reducing the number of metallization and planarization steps in the manufacturing process.

Figure 2A:
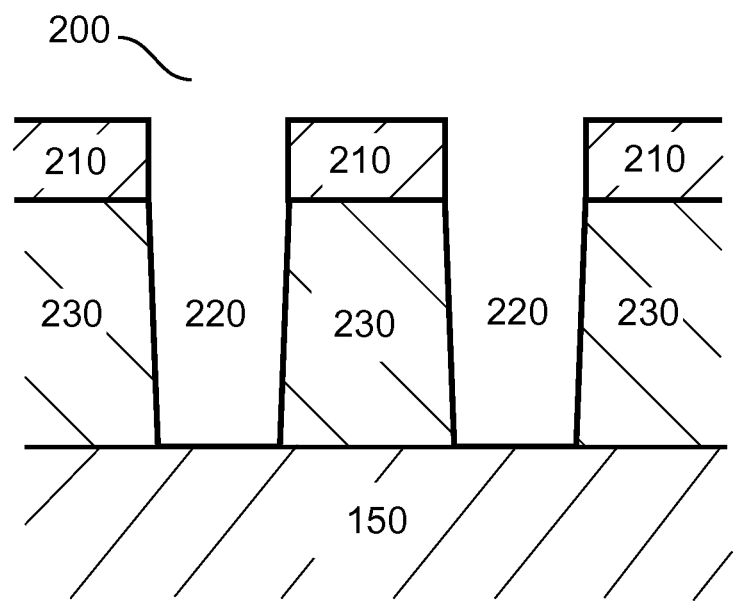
FIG. 2A is cross-sectional view of recesses for vias in a dual damascene process.

FIG. 2A is cross-sectional view of via recesses 220 for vias in a dual damascene process, in which the via recesses 220 are defined by a single lithography step. A photo-resist 210 is deposited on a dielectric layer 230, which has a thickness roughly equals to a sum of the inter-layer dielectric (ILD) 130 and the inter-metal dielectric (IMD) 140 of FIG. 1 is a conventional process. The via recesses 220 are etched through openings in the photo-resist 210. Since it is a single etch process, sidewalls of the via recesses 220 are relatively smooth without jogs.

Figure 2B:
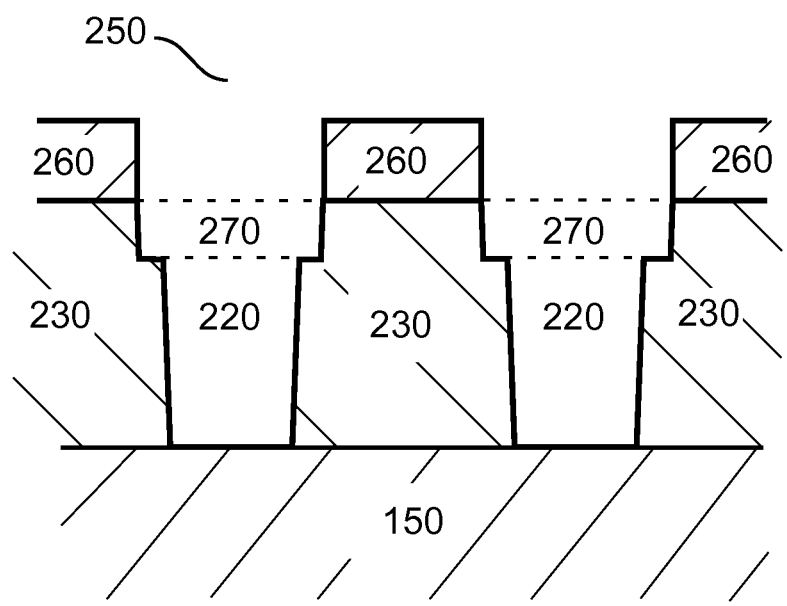
FIG. 2B is cross-sectional view of recesses for both vias and interconnect metals in a dual damascene process.

FIG. 2B is cross-sectional view of recesses for both vias and interconnect metals in the dual damascene process. After forming the via recesses 220 in the dielectric layer 230, another photo-resist layer 260 is deposited on the dielectric layer 230. Openings in the photo-resist layer 260 define channel areas, typically wider than the via recesses 220. The channel recesses 270 are formed by another etch process. A time duration of the etch process determines a depth of the channel recesses 270.

After the etching, the via recesses 220 and trench recesses 270 are filled in a single metal-deposition step. After the filling, excess metal that is deposited outside the trench is removed by a CMP process, and a planar structure with metal inlays is achieved. In a modern dual damascene process, a height-to-width aspect ration of the via-plus-trench may be larger than 3. A width of the via recesses 220 or trench recesses 270 as well as a space between two recesses 220 or 270 may be smaller than 0.3 um. Although the dual damascene process mostly uses Cu as the deposited metal, one having skills in the art would appreciate that other metals, such as TaN, SiC, W, TiN, Ag, Au or a combination, may also be deposited in the via-and-trench recesses.

Figure 3A:
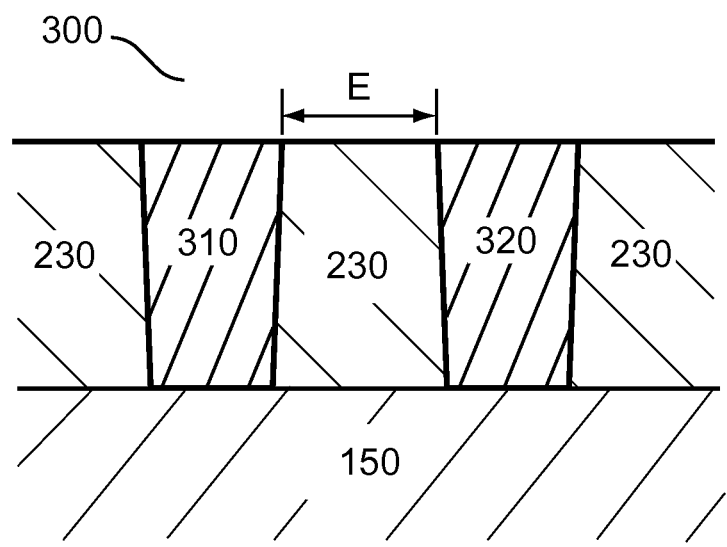
FIG. 3A is a cross-sectional view of a horizontal stack capacitor structure according to an embodiment of the present invention.

FIG. 3A is a cross-sectional view of a horizontal capacitor structure 300 produced by the dual-damascene process according to an embodiment of the present invention. Metal lines 310 and 320 are a result of filling the via recesses 220 shown in FIG. 2A in the single metal-deposition step. The metal lines 310 and 320 serve as a cathode and anode of the capacitor structure 300, respectively. Then height H of the capacitor structure 300 equals a sum of the metal thickness and via depth in a conventional non damascene process as shown in FIG. 1. Both the inter-layer-dielectric (ILD) 130 and inter-metal-dielectric (IMD) 140 serves as dielectric for the capacitor structure 300. Here, the ILD 130 refers to a dielectric between two, often conductive layers, such as metal or polysilicon layers. The IMD 140 refers to a dielectric sharing the same layer as a metal, filling gaps between the metal.

Referring again to FIG. 3A, the sidewalls of the metal lines 310 and 320 are substantially straight due to the single etching process described in the above paragraphs. Therefore, a space E between the metal lines 310 and 320 is determined solely by a via spacing design rule. As processing technologies progresses, the space E is shrinking to a level comparable to oxide thicknesses in conventional vertical stack capacitor structures. With improved height H and minimized space E, the capacitor structure 300 achieves a greater capacitance per unit length of the metal lines 310 and 320. Besides, since the metal used to form the metal lines 310 and 320 is Cu in the dual damascene process, sheet resistance of the capacitor structure 300 is relatively low, which enables the capacitor structure 300 to be used in high speed switching applications. On the other hand, since forming the capacitor structure 300 does not require any addition processing step, hence the cost associated with manufacturing such capacitor structure 300 is low as well.

Figure 3B:
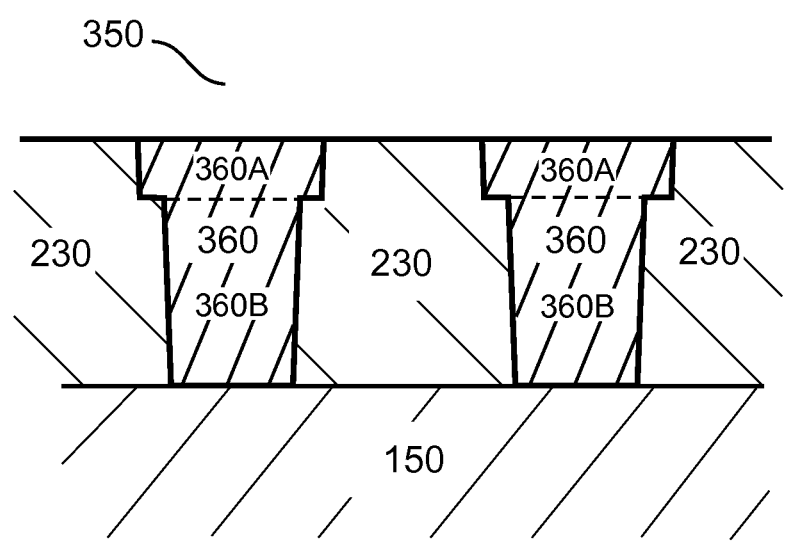
FIG. 3B is a cross-sectional view of a connection area for the capacitor structure shown in FIG. 3A.

FIG. 3B is a cross-sectional view of a connection area 350 for the capacitor structure 300 shown in FIG. 3A. Metal lines 360 are formed by depositing the metal in the via recesses 220 and channel recesses 270 in the same metal deposition step that forms the metal lines 310 and 320 of FIG. 3A. Therefore, a metal width at a channel portion 360A is wider than that at a via portion 360B. Metal lines 360 may serve as connections between the capacitor structure 300 and other devices in an integrated circuit.

Figure 4:
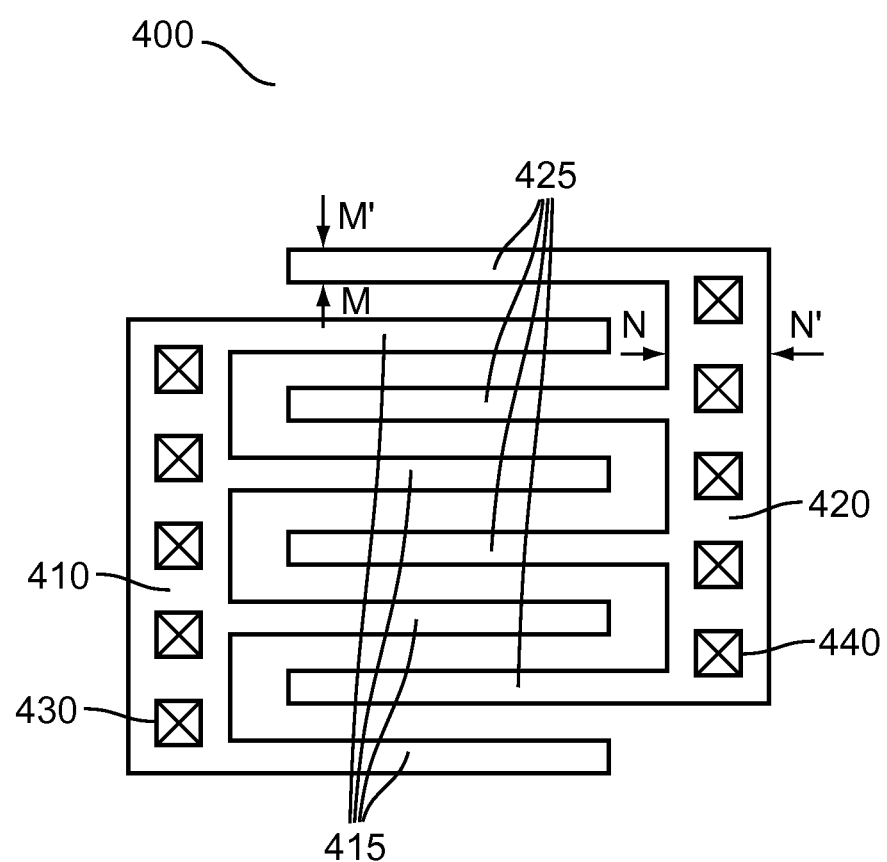
FIG. 4 is a top view of the capacitor structure shown in FIG. 1 being layout in a cross-finger style.

FIG. 4 is a top view of a capacitor structure 400 with conductive plates placed in a cross-finger style according to another embodiment of the present invention. Essentially the capacitor structure 400 is obtained by placing multiples of the capacitor structure 300 shown in FIG. 3A next to each other. Referring to FIG. 4, fingers 415 are connected to one terminal of the capacitor structure 400 through a connection area 410 and via 430. Fingers 425 are connected to another terminal of the capacitor structure 400 through a connection area 420 and vias 440. Cross-sections of the fingers 415 and 425 may be identical, and at a location M-M' the finger cross-section is the same as the metal line 310 or 320 shown in FIG. 3A. Cross-sections of the connection areas 410 and 420 may also be identical. At a location N-N' the connection area cross-section is the same as the connection area 350 shown in FIG. 3B. Each finger of the fingers 415 is flanked by two fingers of the fingers 425, except the ones on the very edge of the capacitor structure 400, therefore for a given length of the fingers 415 or 425, capacitor area is essentially doubled. Only the horizontal stack structure can utilize this cross-finger style layout, which offers another advantage to the capacitor structure 400.

Figure 5:
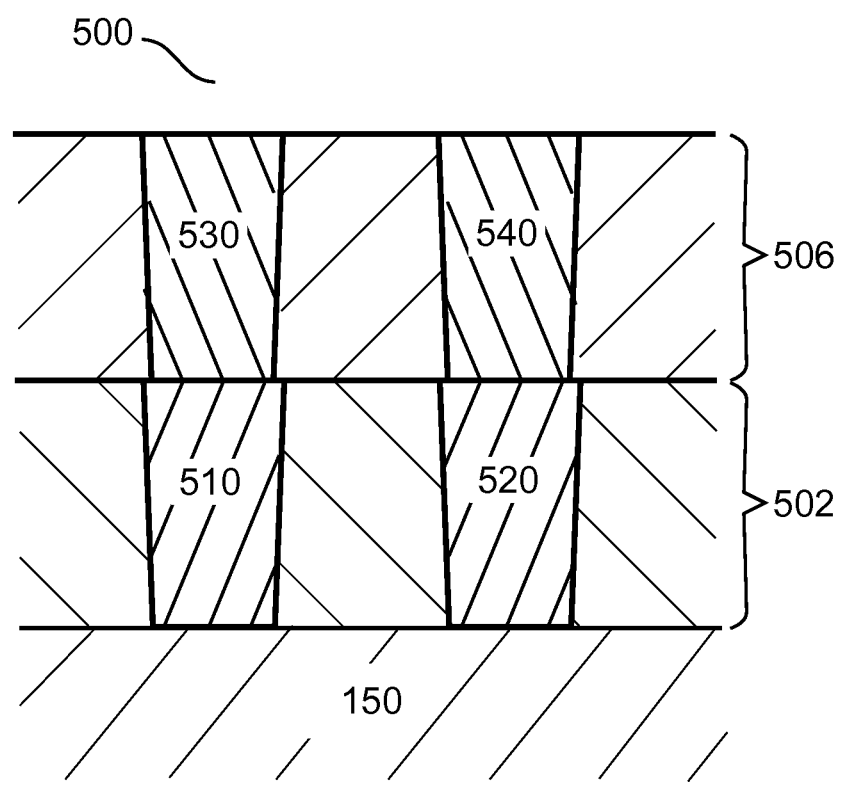
FIG. 5 is a cross-sectional view of a vertically stacked capacitor structure according to another embodiment of the present invention.

FIG. 5 is a cross-sectional view of a vertically stacked capacitor structure 500 according to yet another embodiment of the present invention. Sections 502 and 506 are capacitor structures individually similar to the capacitor structure 300 shown in FIG. 3A. They are so designed and processed that a conductor 530 of the section 506 is stacked on and in contact with a conductor 510 of the section 502, and similarly, a conductor 540 of the section 506 is stacked on and in contact with a conductor 510 of the section 502. A sum of the conductors 510 and 530 serves as one conductive plate while a sum of the conductors 520 and 540 serves as another conductive plate of the capacitor structure 500. Therefore, the capacitance area per unit length of the capacitor structure 500 is essentially doubled than that of the capacitor structure 300 shown in FIG. 3A. In a modern dual damascene process, widths of the vias 510 and 530, and widths of the vias 520 and 540, are drawn equal in a layout, because aligning processes are done through the transparent dielectric film, which allows tighter design-rule tolerances to be used when performing this alignment. A slight misalignment between the vias 510 and 530 or between the vias 520 and 540 is often negligible in terms of performance and reliability.

Although only the two-stack capacitor structure 500 is shown in FIG. 5, one skilled in the art would recognize that more than two stacks can be formed just in the same way as the two stacks described above. For practical reasons, a total number of stacks should be no more than ten.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A horizontal capacitor in an integrated circuit, comprising:
    a plurality of first conductive lines and second conductive lines formed on a first dielectric layer and placed in a cross-finger manner to form a first plate for serving as a cathode and a second plate for serving as an anode of the capacitor,
    wherein the first and second conductive lines are provided by filling first and second via recesses with a conductive material, thereby forming first via lines and second via lines that are extended in a horizontal direction to form the first and second plates placed in a cross-finger manner, said via lines being formed in a second dielectric layer disposed on the first dielectric layer; and
    a first connection area horizontally connected to the first plate and a second connection area horizontally connected to the second plate for connecting the first and second plates to other parts of the integrated circuit, respectively,
    wherein each of the first and second connection areas comprises a channel portion disposed on a via portion, the channel portion being formed by filling channel recesses and wider than the via portion, and both the channel and via portions being formed in the second dielectric layer and filled with said conductive material, and
    wherein a height of the first and second conductive lines is substantially equal to that of the connection area.

2. The capacitor of claim 1, wherein the conductive material comprises copper (Cu) to reduce a sheet resistance of the capacitor.

3. The capacitor of claim 1, wherein both the first and second conductive lines are longer than 1 um with less than 0.3 um line width and space.

4. The capacitor of claim 1, wherein the first and second conductive lines both have a height-to-width aspect ratio larger than 3.

5. The capacitor of claim 1, wherein the dielectric material is made of materials selected from the group consisting of SiO2, oxide, high K dielectric with a dielectric constant larger than 4.5, low K dielectric with a dielectric constant smaller than 3 and a combination of two or more of these materials.

6. The capacitor of claim 1, wherein the first and second conductive lines have a space within a range of about 5 nm to 100 nm.

7. The capacitor of claim 1 further comprising a third conductive line, the third conductive line being connected to the first conductive line, and the second conductive line being flanked by the first and third conductive lines.

8. The capacitor of claim 1 further comprising a fourth and fifth conductive lines stacked on top of and in contact with the first and second conductive lines, respectively.

9. The capacitor of claim 1, wherein each of the first and second conductive lines is made of materials selected from the group consisting of Al, Cu TaN, SiC, W, TiN, Ag, Au and a combination of two or more of these materials.

* * * * *